United States Patent
Matsuo et al.

(10) Patent No.: US 8,462,827 B2
(45) Date of Patent: Jun. 11, 2013

(54) PHOTONIC CRYSTAL DEVICE

(75) Inventors: Shinji Matsuo, Atsugi (JP); Takaaki Kakitsuka, Atsugi (JP); Masaya Notomi, Atsugi (JP); Akihiko Shinya, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 13/392,849

(22) PCT Filed: Sep. 1, 2010

(86) PCT No.: PCT/JP2010/005390
§ 371 (c)(1),
(2), (4) Date: Feb. 27, 2012

(87) PCT Pub. No.: WO2011/027555
PCT Pub. Date: Mar. 10, 2011

(65) Prior Publication Data
US 2012/0155502 A1  Jun. 21, 2012

(30) Foreign Application Priority Data
Sep. 1, 2009  (JP) .................. 2009-201424

(51) Int. Cl.
*H01S 5/00* (2006.01)
(52) U.S. Cl.
USPC .............. 372/50.124; 372/45.01; 372/50.11; 372/70
(58) Field of Classification Search
USPC ....................................... 372/50.11
See application file for complete search history.

(56) References Cited

U.S. PATENT DOCUMENTS

| | | | |
|---|---|---|---|
| 6,674,778 B1 | 1/2004 | Lin et al. | |
| 6,711,200 B1* | 3/2004 | Scherer et al. | 372/64 |
| 7,085,301 B2* | 8/2006 | Choquette et al. | 372/50.124 |
| 2005/0002605 A1 | 1/2005 | Sakai et al. | |
| 2007/0177644 A1* | 8/2007 | Corzine | 372/44.01 |
| 2008/0273832 A1 | 11/2008 | Kiyota et al. | |
| 2009/0225804 A1* | 9/2009 | Sasahata et al. | 372/45.01 |
| 2010/0226609 A1* | 9/2010 | Tokushima | 385/50 |

FOREIGN PATENT DOCUMENTS

| | | |
|---|---|---|
| JP | 2004-334190 | 11/2004 |
| JP | 2005-274927 A | 10/2005 |
| JP | 2006-047895 A | 2/2006 |
| JP | 2007-129028 A | 5/2007 |

(Continued)

OTHER PUBLICATIONS

International Preliminary Report on Patentability issued on Mar. 6, 2012 in Application No. PCT/JP2010/005390 filed Sep. 1, 2010, with English translation.

(Continued)

*Primary Examiner* — Xinning Niu
(74) *Attorney, Agent, or Firm* — Workman Nydegger

(57) ABSTRACT

The objective of the invention is to provide a photonic crystal device which enables efficient confinement of carriers while preventing the deterioration of device characteristics. Specifically a photonic crystal device has a photonic crystal in which media with different refractive indexes are regularly arranged, wherein an active region (11) includes an active layer (12) and carrier confinement layers (13, 14) provided on the top and bottom of the active layer (12) respectively for confining carriers. The photonic crystal is formed by a buried growth layer (15) with a larger bandgap than that of the active region (11).

14 Claims, 19 Drawing Sheets

FOREIGN PATENT DOCUMENTS

| | | |
|---|---|---|
| JP | 2007-201293 A | 8/2007 |
| JP | 2007-220922 A | 8/2007 |
| JP | 2008-078418 | 4/2008 |
| JP | 2009-054795 A | 3/2009 |
| JP | 2009-239260 | 10/2009 |

OTHER PUBLICATIONS

Kengo Nozaki, et al., "Room temperature continuous wave operation and controlled spontaneous emission in ultrasmall photonic crystal nanolaser," Optics Express, vol. 15, No. 12, pp. 7506-7514, Jun. 11, 2007.

Takasumi Tanabe, et al., "All-optical switches on a silicon chip realized using photonic crystal nanocavities", AIP Applied Physics Letters, 87, 151112-1 (2005), doi: 10.1063/1.2089185, http://dx.doi.org/10.1063/1.2089185.

International Search Report dated Oct. 19, 2010, issued in International Application No. PCT/JP2010/005390 filed Sep. 1, 2010.

Office Action dated Feb. 5, 2013 issued in Japanese Application No. JP 2011-529814, with English translation.

Office Action dated Mar. 26, 2013 issued in related Chinese Application No. 201080038871.2.

* cited by examiner

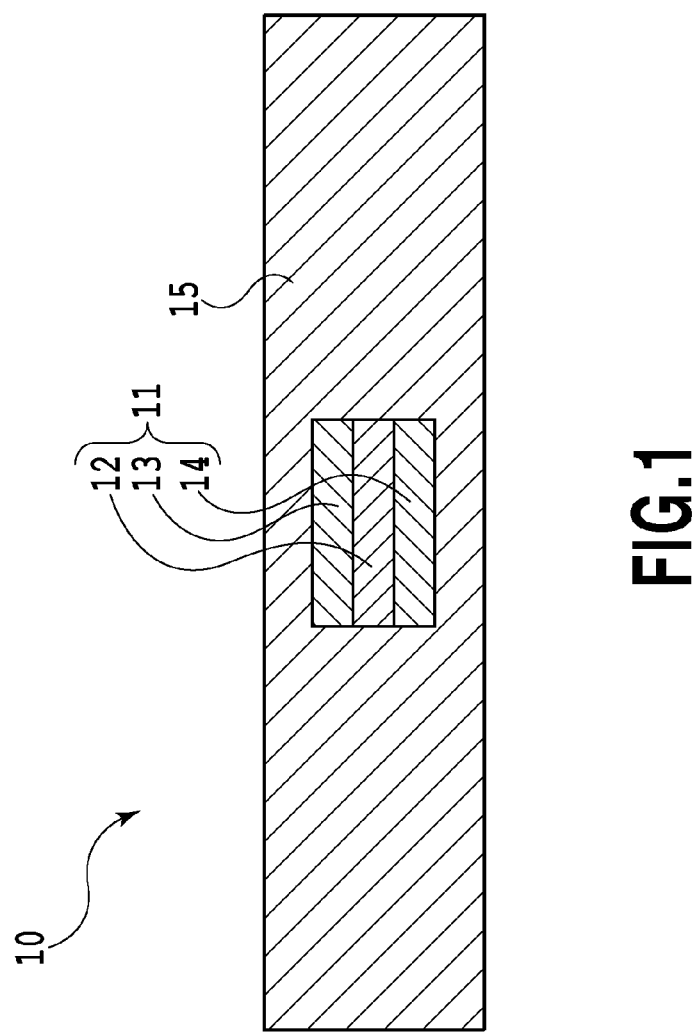

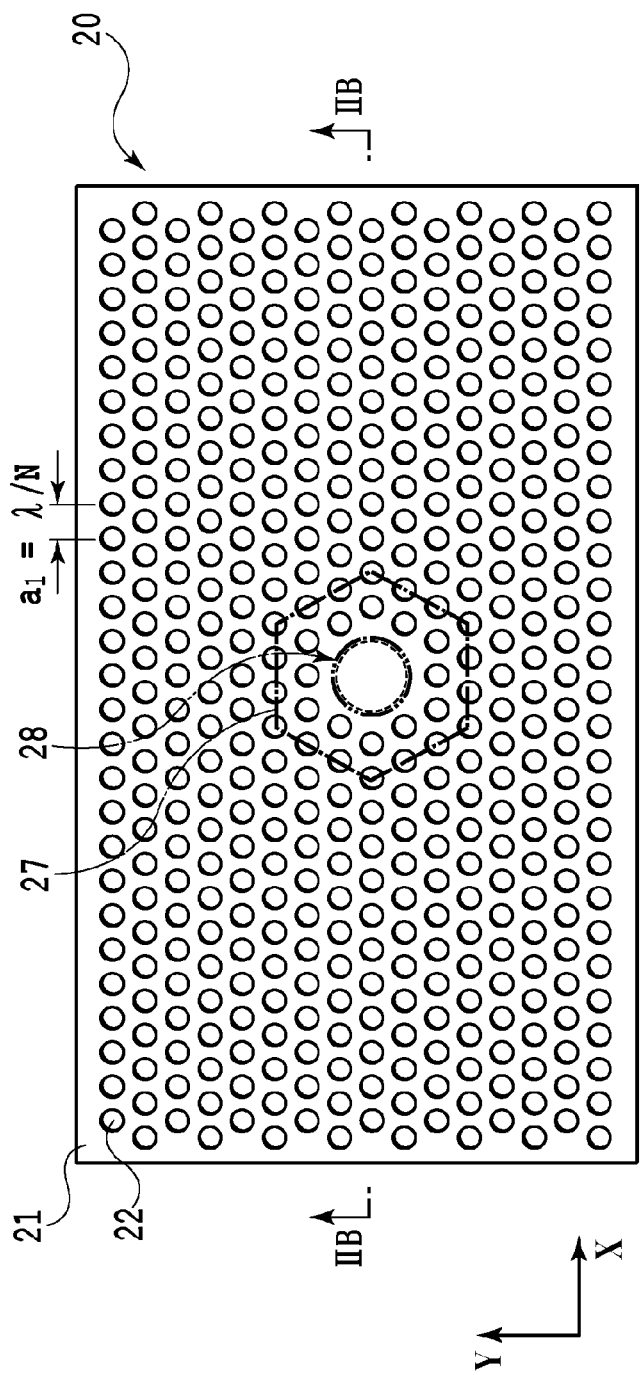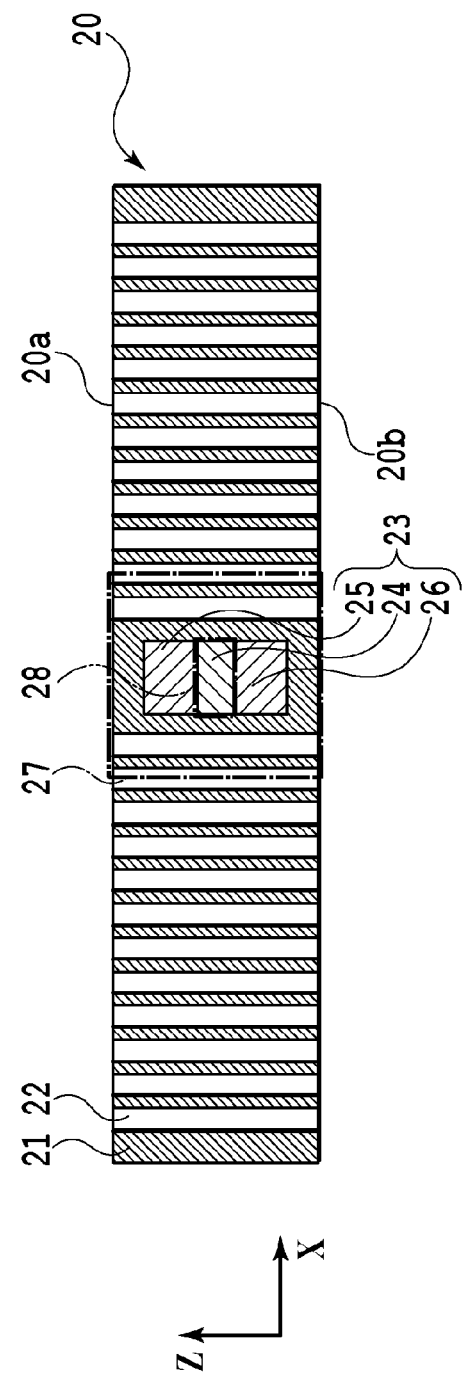
FIG.2A
FIG.2B

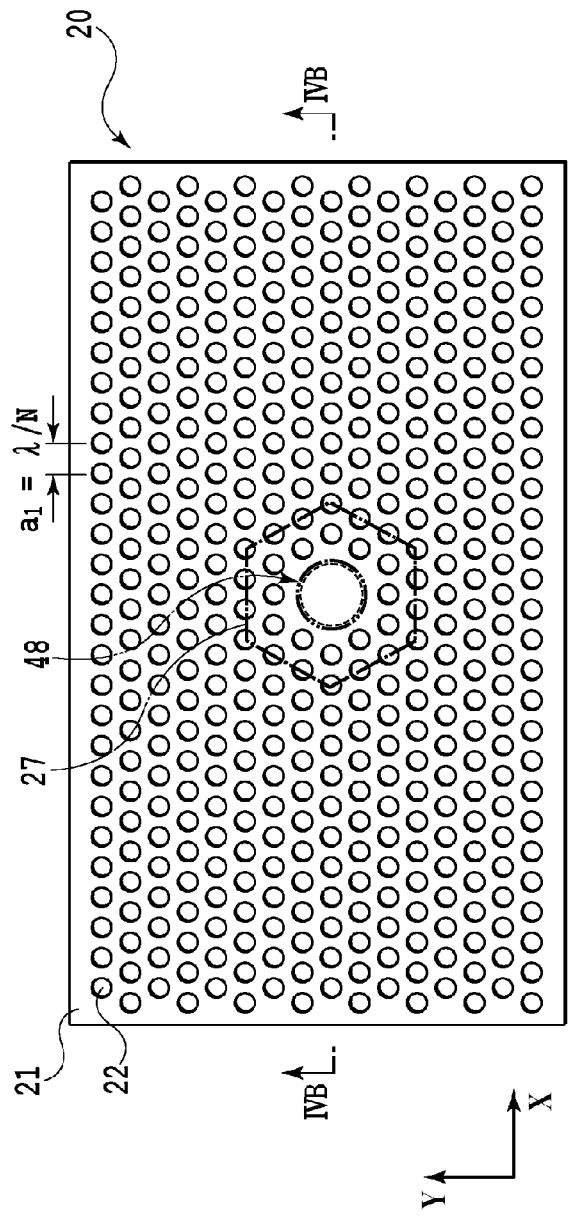
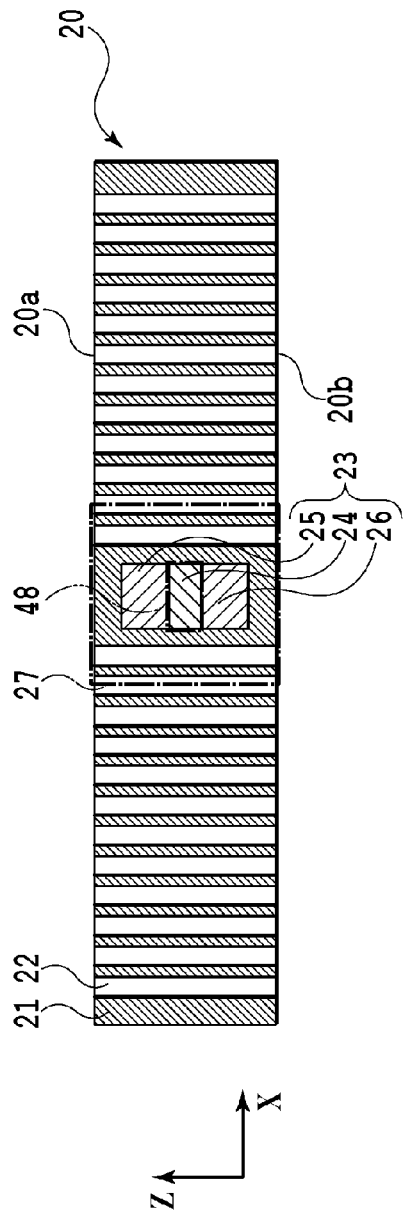
FIG.4A
FIG.4B

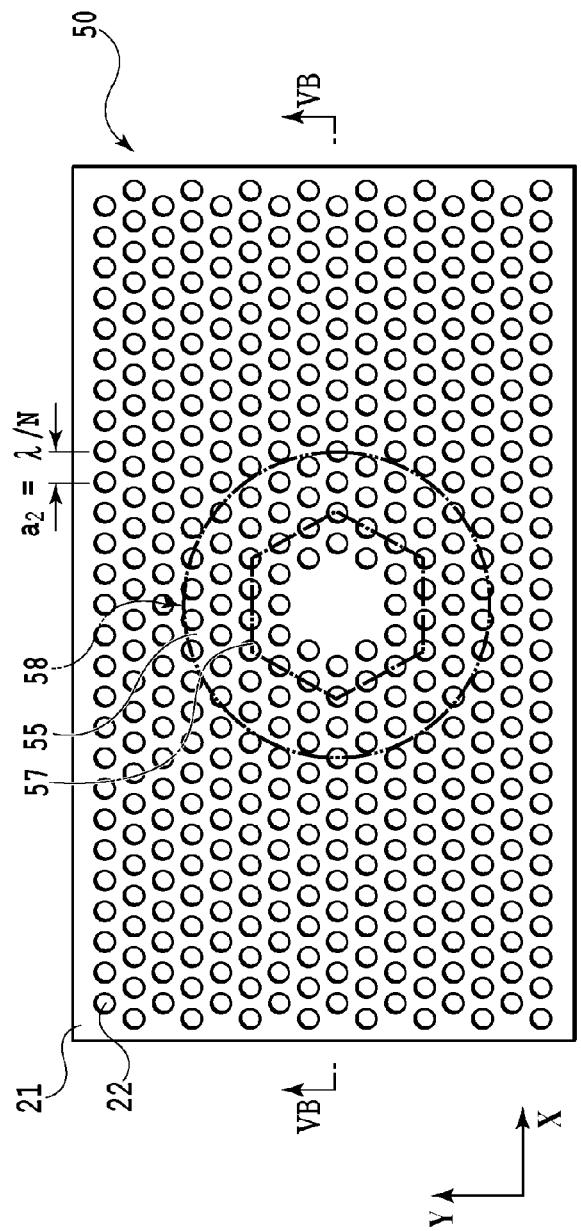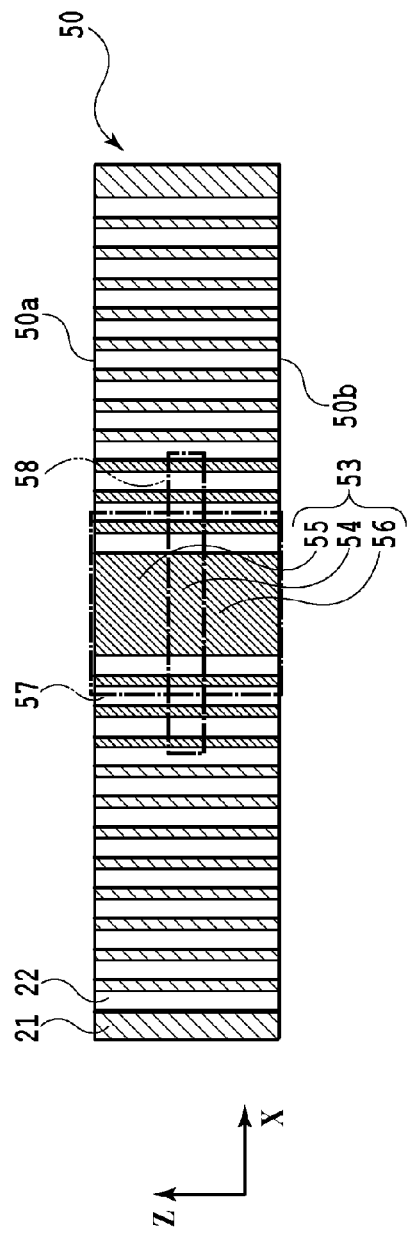
FIG.5A
FIG.5B

US 8,462,827 B2

PHOTONIC CRYSTAL DEVICE

TECHNICAL FIELD

The present invention relates to a photonic crystal device, and more particularly, relates to a semiconductor laser for which a semiconductor microcavity is employed and a semiconductor optical switch.

BACKGROUND ART

Because of the explosive growth in Internet traffic in recent years, transmission capacities between nodes have been increased by employing light for transmissions performed between nodes. For this, a large channel capacity is realized by exploiting one of the features of light, i.e., low loss. Further, for short distance transmission, performed between boards or racks that have been mounted in a data communication apparatus, the replacement of electrical wires has been begun by utilizing the high-speed transmission feature. Furthermore, bottlenecks are pointed out for electrical wiring used between LSI chips and on LSI chips, and a feasibility study for the provision of optical fiber cables has been begun.

A microcavity laser is a laser having a micron-order size that is aimed at large-scale integration of a photonic integrated circuit or an LSI that is employed for the above described application.

As such a microcavity laser, a pumped microcavity laser having a photonic crystal resonator has been proposed, as in non patent literature 1. The enlarged image, taken by an electron microscope, of a H0 nanolaser shown in FIG. 1(b) in non patent literature 1, is shown in FIG. 18A, a mode intensity characteristic and a laser spectrum along a laser threshold, which are illustrated in FIG. 2 (c) in non patent literature 1, are shown in FIG. 18B, and a relationship between normalized pump power and an intensity, illustrated in FIG. 2(d) in non patent literature 1, is shown in FIG. 18C. According to this, continuous laser oscillation at room temperature has been observed by employing a two-dimensional photonic crystal slab that is one of the photonic crystal resonator types. However, although a clear threshold value can be seen, the laser oscillation is confirmed only until a point immediately above the threshold value. This is due to the following reasons. Since the volume of an active layer (core layer) is two digits or more smaller for a microcavity laser than for an ordinary laser, light confinement efficiency for the resonator must be increased in order to obtain continuous oscillation at room temperature. Therefore, a large difference in a refractive index between a semiconductor and air is employed for a two-dimensional photonic crystal slab. As a result, efficient light confinement can be provided and continuous oscillation at room temperature can be obtained. However, since the thermal conductivity of air is extremely low, heat generated at the active layer can not effectively be radiated. Therefore, when the excitation intensity is increased, the rise of the temperature of the active layer occurs and halts oscillation, and a high light intensity can not be obtained. Furthermore, in order to provide efficient light confinement, it is important that a fluctuation in the thickness of the two-dimensional slab, sandwiched by air, should be reduced. Therefore, an epitaxial growth substrate having the same composition is employed for the entire area across which the beam of a microcavity laser is spreading. However, when this epitaxial substrate of the same composition is employed, carriers generated by light excitation are diffused isotropically to the outside of the resonator, so that the excited carriers can not be efficiently converted into those to be used for laser oscillation, and an increase in the threshold value and a reduction in the output intensity occur.

The photonic crystal resonator can be employed also as an optical switch by using a change in a refractive index involved in the excitation of carriers in the photonic crystal. For example, in non patent literature 2, carriers are generated in a resonator included in a photonic crystal, and a change in a transmittance involved in modulation of the refractive index of the resonator is employed as an optical switch.

However, since the confinement of carriers is not taken into account in this case, as well as in the above described laser, carriers excited in a very small space are rapidly diffused, and a device having extremely low efficiency is provided. Further, since with this structure heat can not be easily dissipated, heat that is generated upon carrier relaxation is accumulated, and a rise of temperature due to the accumulation of heat causes deterioration of the device characteristics.

CITATION LIST

Non Patent Literature

[NPL 1] "Room temperature continuous wave operation and controlled spontaneous emission in ultrasmall photonic crystal nanolaser", Kengo Nozaki, et. al., Optics Express, Vol. 15, No. 12, pp. 7506-7514, Jun. 11, 2007

[NPL 2] "All-optical switches on a silicon chip realized using photonic crystal nanocavities", Takasumi Tanabe, et. al., APPLIED PHYSICS LETTERS 87, 151112-1 to 3, 2005

SUMMARY OF INVENTION

As described above, according to the photonic crystal resonator, efficient light confinement can be provided, but carriers generated in the resonator are widely diffused to the outside of the active region, and therefore, a problem that the utilization efficiency of carriers is low occurs. Furthermore, since with the structure heat can not be easily dissipated, heat that is generated during the operation of the device that employs the photonic crystal resonator is accumulated in the photonic crystal resonator, and therefore, another problem that the accumulation of heat causes the deterioration of the device characteristics.

The present invention is proposed while taking these problems into account, and the objective of the invention is to provide a photonic crystal device that enables the efficient confinement of carriers, while preventing the deterioration of the device characteristics.

In order to achieve this objective, according to the present invention, a photonic crystal device, which includes a resonator formed with a photonic crystal structure, is characterized by comprising: an active region; and a buried growth layer having a larger bandgap than that of the active region.

Specifically, a first aspect of the present invention is a photonic crystal device, characterized by comprising:

a photonic crystal where first and second media having different refractive indexes are regularly arranged; and an active region in the photonic crystal, wherein the active region includes an active layer and carrier confinement layers provided on the top and bottom of the active layer for confining carriers, and wherein the first medium having a larger refractive index within the first and second media that form the photonic crystal has a larger bandgap than that of the active region. The active layer oscillates light by injection of carriers. According to the photonic crystal device of the first aspect, diffusion of carries outside the active region can be reduced.

Further, a second aspect of the present invention according to the first aspect is characterized in that thermal conductivity of the first medium is higher than thermal conductivity of the active layer. Therefore, heat generated in the active region can be efficiently diffused the outside of the resonator, and during the operation of the device, a rise of the temperature in the active region can be reduced.

A third aspect of the present invention according to the first or the second aspect is characterized in that a waveguide coupled with the active region in the photonic crystal for guiding light. Therefore, incident/outgoing light can be coupled with the waveguide, and coupling of light with the waveguide can be efficiently performed. As a result, a waveguide that either connects the laser to the receiving device, or connects the switches of these devices, can be formed, and a large-scale photonic integrated circuit, etc., can be provided.

A fourth aspect of the present invention according to the third aspect is characterized in that the waveguide is located along an extended line for an optical field of a resonant wavelength confined in a light confinement region of the photonic crystal device.

For the photonic crystal device according to the present invention, a resonator can be manufactured by employing the same method as the conventional method, whereby a interval between some of air holes in the photonic crystal is slightly shifting from an interval between the other air holes. On the other hand, the resonator may be formed without any shifting of air holes.

That is, a fifth aspect of the present invention according to one of the first to the fourth aspects is characterized in that the photonic crystal includes air holes formed periodically, and for the plurality of air holes, a distance between air holes adjacent to the active region is a distance for reducing a difference of equivalent refractive index between the active layer and the first medium.

A sixth aspect of the present invention according to one of the first to the fifth aspects is characterized in that the active region is covered with the first medium. According to the present invention, even if the composition of the active region is the same as the composition of a sacrificial layer provided under the first medium, the active region is covered with the first medium, and therefore, does not contact the air holes, so that etching is performed only for the sacrificial layer, and is not required for the active region to fabricate a two-dimensional photonic crystal slab having an air-bridge structure.

Furthermore, a semiconductor laser according to a seventh aspect of the present invention is characterized by comprising: a photonic crystal device according to one of the first to the sixth aspects, wherein a structure is employed such that laser oscillation is performed by light excitation, and pumping light is mainly absorbed at the active region, and wherein an absorption coefficient of pumping light at the first medium is set so smaller than an absorption coefficient at the carrier confinement layer. As a result, unwanted light absorption, which is not directly related to laser oscillation, is prevented, and heat generation is also prevented. Therefore, a rise in temperature at the active region due to heat generation can be suppressed, and a higher output can be obtained.

A semiconductor laser according to an eighth aspect of the present invention according to the seventh aspect is characterized in that where an oscillation wavelength is set at from 1500 nm to 1600 nm, a photoluminescence wavelength of the active region is set at from 1300 nm to 1400 nm. Therefore, unwanted heat generation can be reduced, compared with a conventional case of pumping light in the 980-nm wavelength range, and excitation is enabled by a laser in the 1300-nm wavelength range, which is widely employed for a laser in an access network system, etc., and the cost of the excitation light source can be reduced.

Moreover, a semiconductor optical switch according to a ninth aspect of the present invention is a semiconductor optical switch that employs a change in transmittance, which occurs with modulation of a refractive index, characterized by comprising a photonic crystal device according to one of the first to sixth aspects.

According to the present invention, a photonic crystal device (a semiconductor laser) that provides a low threshold value and high efficiency, which are appropriate for integration, and a photonic crystal device (a semiconductor optical switch) that can be operated at a low power, both of which could not be provided conventionally, can now be provided.

BRIEF DESCRIPTION OF DRAWINGS

FIG. 1 is a schematic diagram illustrating the structure of a photonic crystal device according to a first embodiment of the present invention;

FIG. 2A is a plan view of the photonic crystal device according to the first embodiment of the present invention;

FIG. 2B is a cross-sectional view taken along a line IIB-IIB in FIG. 2A;

FIG. 4A is a plan view of another example of the carrier injection structure for the photonic crystal device according to the first embodiment of the present invention;

FIG. 4B is a cross-sectional view taken along a line IVB-IVB in FIG. 4A;

FIG. 5A is a plan view of a photonic crystal device according to a second embodiment of the present invention;

FIG. 5B is a cross-sectional view taken along a line VB-VB in FIG. 5A;

DESCRIPTION OF EMBODIMENTS

Figure 3:
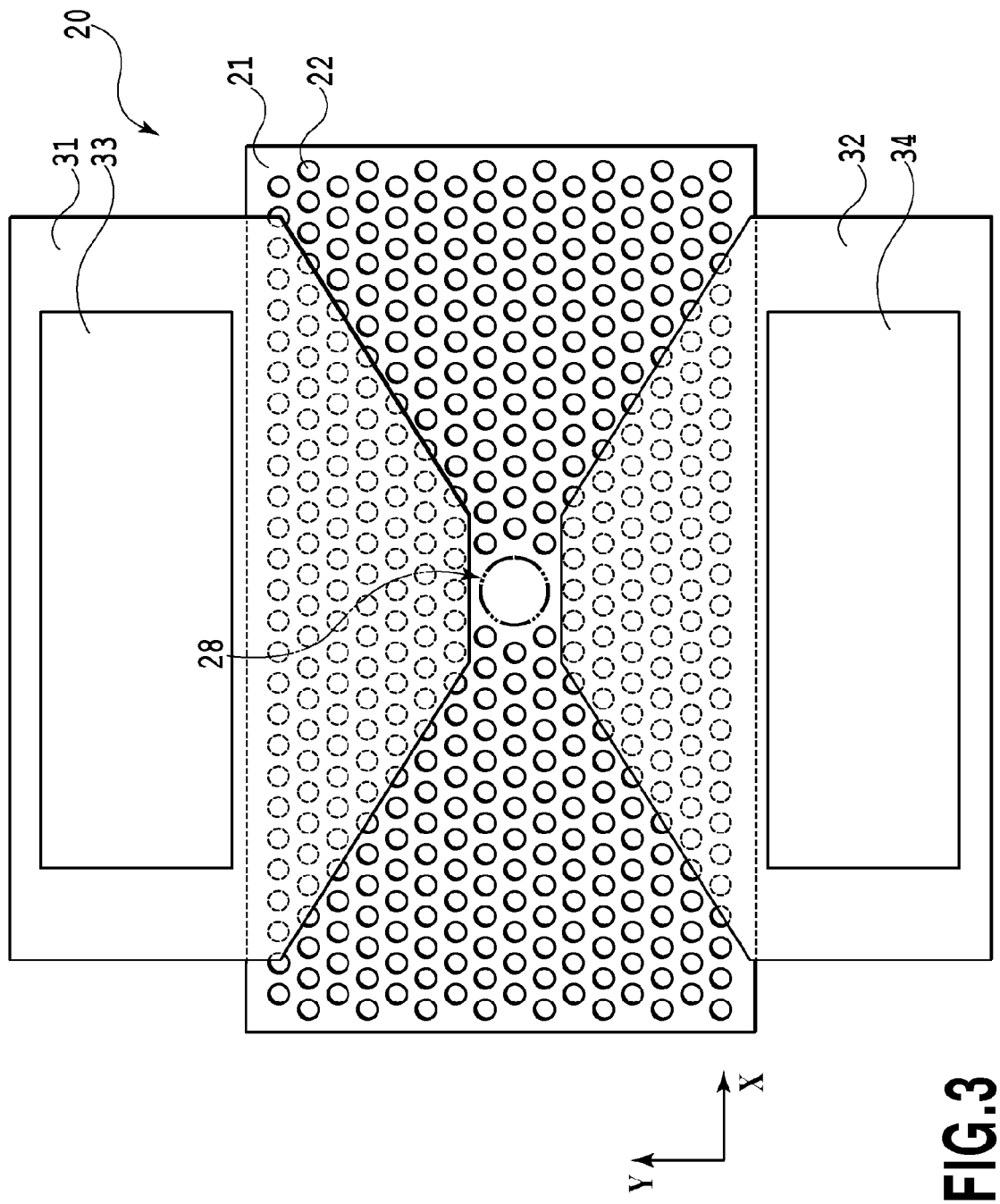
FIG. 3 is a schematic diagram illustrating an example of a carrier injection structure for the photonic crystal device according to the first embodiment of the present invention.

The embodiments of the present invention will now be described in detail, while referring to drawings.

(First Embodiment)

A photonic crystal device according to a first embodiment of the present invention will be described, while referring to FIG. 1. The photonic crystal device according to the first embodiment has a photonic crystal where media having different refractive indices are regularly arranged. The photonic crystal is, for example, a two-dimensional slab where air holes are periodically formed. For a photonic crystal device 10 in FIG. 1, an active region 11 is arranged inside a photonic crystal that is formed in a buried growth layer region 15. The active region 11 includes an active layer 12 and carrier confinement layers 13 and 14, which are provided respectively on the top and the bottom of the active layer 12.

The active layer 12 is formed in a chemical compound (group III-V mixed crystal) that excites light by carrier injection, and for example, InGaAs, GaAs, InGaAsP, etc., can be employed.

The carrier confinement layers 13 and 14 are formed in a chemical compound (group III-V mixed crystal) that prevents diffusion of carriers, and for example, AlGaAs, InGaAsP, InP, etc., can be employed.

The buried growth layer region 15 is formed in a chemical compound (group III-V mixed crystal), for which the thermal conductivity is higher than that of the active region 11 and the bandgap is larger than that of the active region 11, and for example, GaAs, InP, InGaAsP, InAlAsP, etc., can be employed. The thickness of the buried growth layer region 15 is, for example, 200 nm to 400 nm.

A case where the photonic crystal device that includes the photonic crystal with the above described structure is applied for a semiconductor laser (an optical semiconductor apparatus) will now be described, while referring to FIGS. 2 to 4.

As shown in FIGS. 2A and 2B, a photonic crystal device 20 has a photonic crystal wherein air holes 22 are formed, by etching, in a buried growth layer region 21. As for the plurality of air holes 22, an interval $a_1$ between the adjacent air holes is adjusted to a value obtained by calculating (an operating wavelength λ of the photonic crystal device 20)/(a refractive index N of the buried growth layer region 21), and the plurality of air holes 22 are regularly arranged.

A periodic structural disorder (a defect region) in refractive index, i.e., a region where air holes are not formed, is arranged in the buried growth layer region 21. An active region 23 is provided in the defect region. Therefore, the active region 23 is located so as not to contact the air holes 22. In other words, the active region 23 is covered with the buried growth layer region 21. The active region 23 includes an active layer 24 and carrier confinement layers 25 and 26, which are located respectively on the top and the bottom of the active layer 24. Thus, a carrier confinement region 28 to confine carriers is formed at the region that is enclosed by the upper and lower carrier confinement layers 25 and 26 and that matches the active layer 24.

With this arrangement, a resonator is provided while being defined by air from the top and bottom, and by the plurality of air holes 22 in the direction of two-dimensional plane. That is, a region that is enclosed by the air holes 22 located at least at the second layer from the carrier confinement region 28, and an upper face 20a and a lower face 20b of the photonic crystal device 20 is employed as a light confinement region 27 for confining light. As described above, the light confinement region 27 is a region located outward from the active layer 24.

At this time, injection of carriers into the active layer 24 is performed by current injection or light excitation. In a case of employing current injection, for example, as shown in FIG. 3, a p-layer 31 and an n-layer 32 are formed near the carrier confinement region 28 by ion implantation, and a P-electrode 33 and an N-electrode 34 are formed above the p-layer and the n-layer 32, respectively. Current injection is performed in the lateral direction (the transverse direction) of the photonic crystal. When a current is injected to the electrodes 33 and 34, the carriers injected into the active layer 24 are confined in the carrier confinement layers 25 and 26.

A case where light excitation is performed to inject carriers into the active layer 24 will now be described, while referring to FIG. 4. As shown in FIG. 4, in cases where pumping light is absorbed in the carrier confinement layers 25 and 26 and the active layer 24, the carriers are confined in the entire active layer region. That is, the whole active region 23 becomes a light excitation carrier confinement region 48. Therefore, carriers can be injected into the active layer 24.

Therefore, according to the photonic crystal device 20 of this embodiment, since the active region 23 that includes the active layer 24 and the carrier confinement layers 25 and 26 is arranged in the photonic crystal, and the photonic crystal is formed in the buried growth layer 21 that has a larger bandgap than the active region 23, diffusion of the carrier outside the active region 23 can be reduced.

(Second Embodiment)

A photonic crystal device according to a second embodiment of the present invention will be described, while referring to FIG. 5. The photonic crystal device of the second embodiment is a device wherein an active region is provided both for a defect region and for a region where air holes are formed, and the structure for the other portions is the same as that for the photonic crystal device of the first embodiment.

As shown in FIGS. 5A and 5B, a photonic crystal device 50 includes a photonic crystal wherein air holes 22 are periodically formed in a buried growth layer region 21.

A defect region is allocated in the photonic crystal device 50, and an active region 53 is arranged with this region as the center. The active region 53 is formed centering around the detect region, is formed larger than the air hole and is extended to, for example, the air holes 22 located at the fourth layer. The active region 53 serves as one part of an upper face 50a and one part of a lower face 50b of the photonic crystal device 50. The active region 53 includes an active layer 54 and carrier confinement layers 55 and 56, which are located respectively on the top and bottom of the active layer 54. As a result, a carrier confinement region 58 to confine carriers is formed in the region that matches the active layer 54, which is enclosed by the upper and lower carrier confinement layers 55 and 56.

With this arrangement, a resonator is provided while being defined by air from the top and bottom, and by the plurality of air holes 22 in the direction of two-dimensional plane. That is, a region that is enclosed by the air holes 22, located at least at the second layer centering around the defect region, and the upper face 50a and the lower face 50b of the photonic crystal device 50 is employed as a light confinement region 57 for confining light. As described above, the light confinement region 57 is located inside the active layer 54 in the lateral direction of the photonic crystal device 50.

Therefore, according to the photonic crystal device 50 of this embodiment, as well as the photonic crystal device 20 of the first embodiment described above, diffusion of the carries outside the active region 53 can be reduced. Further, the carrier confinement region 58 can be provided outside the light confinement region 57.

In the above description, the photonic crystal device 50 where the carrier confinement region 58 is provided outside the light confinement region 57 has been employed. However, when the size of the active region 53 is adjusted, a photonic crystal device can also be provided wherein a carrier confinement region for confining carriers and a light confinement region for confining light are in the same size in the lateral direction of the photonic crystal device. For such a photonic crystal device, since the refractive index is uniform in the light confinement region 57, air holes are formed in the same manner as in the conventional method, whereby the period for positioning the air holes near the defect area is slightly shifted from the period for positioning the other air holes, so that a resonator that provides efficient confinement can be manufactured. Then, the same operating effects as obtained by the above described photonic crystal device 50 are provided, and an oscillation threshold value can be reduced.

(Third Embodiment)

A photonic crystal device according to a third embodiment of the present invention will be described, while referring to FIG. 6. The photonic crystal device of the third embodiment is a device, for which the same structure as that of the photonic crystal device of the above described second embodiment is provided, and of which a buried growth layer region is formed in a chemical compound (group III-V mixed crystal), for which thermal conductivity is higher than that for an active layer. In this embodiment, an AlAs layer is employed as a sacrificial layer to form an air-gap structure, and the same chemical compound (group III-V mixed crystal) is employed for a buried growth layer region and a carrier confinement layer.

Figure 6:
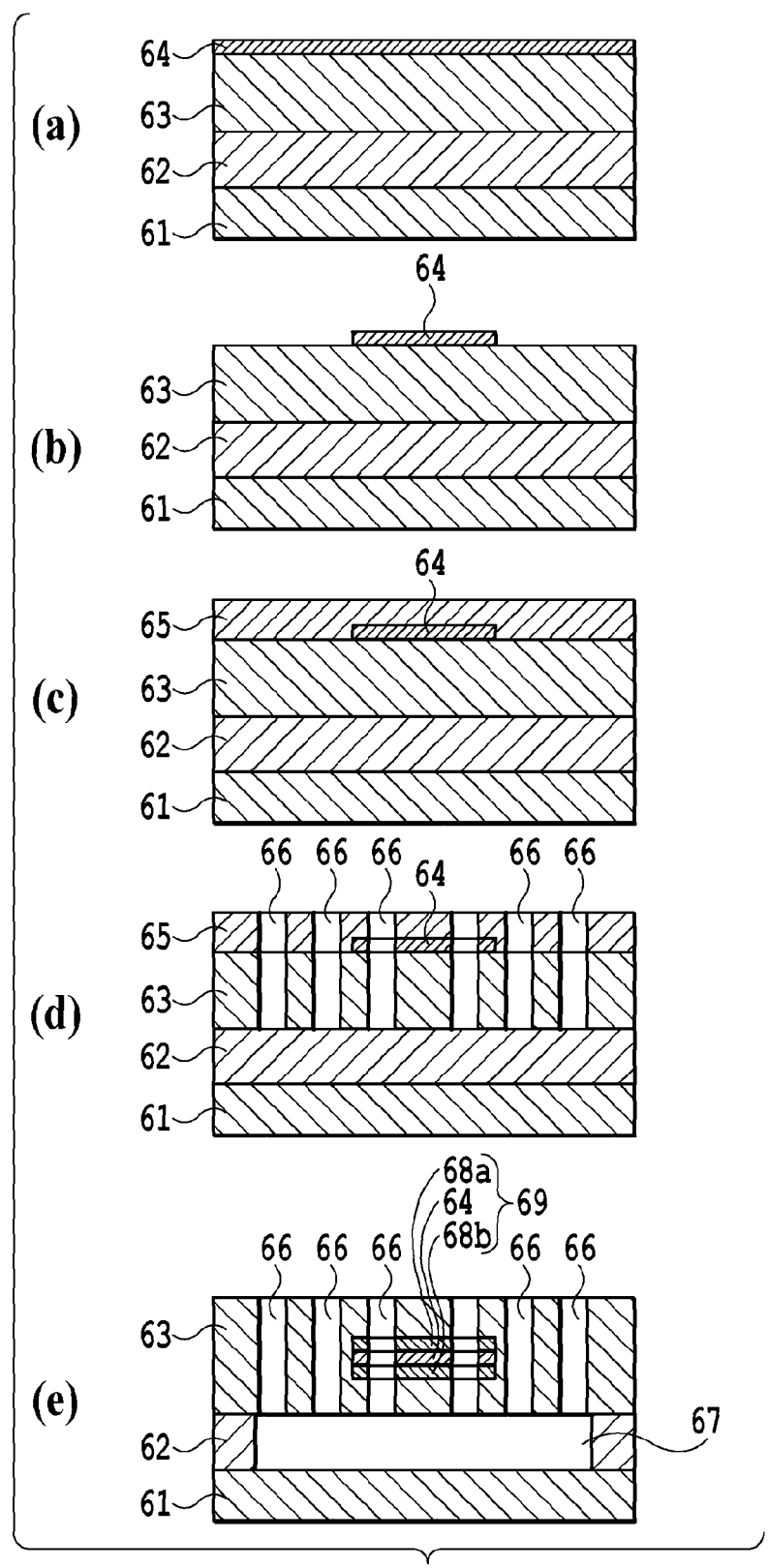
FIG. 6 is a process diagram showing the procedures of a fabrication method for a photonic crystal device according to a third embodiment of the present invention.

The photonic crystal device of this embodiment is fabricated by performing the procedures in FIG. 6. First, as shown in FIG. 6(a), by the MBE (Molecular Beam Epitaxy) method, an AlAs sacrificial layer 62, a GaAs layer (a buried growth layer region and a carrier confinement layer) 63 and an InGaAs active layer 64 are permitted to grow on a GaAs substrate 61 in the named order.

Following this, as shown in FIG. 6(b), the part of the InGaAs active layer 64, except for the portion that serves as an active region, which will be described later, is removed by etching.

As shown in FIG. 6(c), the MBE method is employed again, and a GaAs layer (a carrier confinement layer and a buried growth layer region) 65 is grown on the entire surface, so that an epitaxial growth substrate is obtained.

Sequentially, the above described epitaxial growth substrate is dry-etched, and as shown in FIG. 6(d), air holes 66 are formed. The plurality of air holes 66 are extended through the GaAs layer 65 and the GaAs layer 63, and are also extended from the GaAs layer 65 through the InGaAs active layer 64 and the GaAs layer 63. The plurality of air holes 66 are arranged, so that the adjacent air holes 66 are located periodically, and that the InGaAs active layer 64 is located in the center of the defect region.

Next, oxidation of the AlAs sacrificial layer 62 is performed at a high temperature, and through the air holes 22, only the oxidized layer is wet-etched using hydrofluoric acid. As a result, as shown in FIG. 6(e), an air hole 67 is formed at a layer under the region that is enclosed by the air holes 66 in the direction of two-dimensional plane.

Therefore, through performing the above described process, a photonic crystal device can be fabricated, wherein the active region 69, in which carrier confinement layers 68a and 68b formed of GaAs are arranged on the top and bottom of the active layer 64 formed of InGaAs, is provided inside the buried growth layer region 63 formed of GaAs, and wherein the plurality of air holes 66 are formed in the buried growth layer region 63 that includes the active region 69. In other words, a microcavity laser, for which an optical field distribution and a carrier distribution substantially match, can be fabricated.

(Fourth Embodiment)

A photonic crystal device according to a fourth embodiment of the present invention will be explained, while referring to FIG. 7. The photonic crystal device of the fourth embodiment is a device that includes the same structure as the photonic crystal device of the first embodiment, wherein a buried growth layer region is formed in a chemical compound (group III-V mixed crystal), for which thermal conductivity is higher than that for an active layer. In this embodiment, an InGaAs layer is employed as a sacrificial layer to form an air-gap structure, and the same chemical compound (group III-IV mixed crystal) is employed for a buried growth layer region and a carrier confinement layer.

Figure 7:
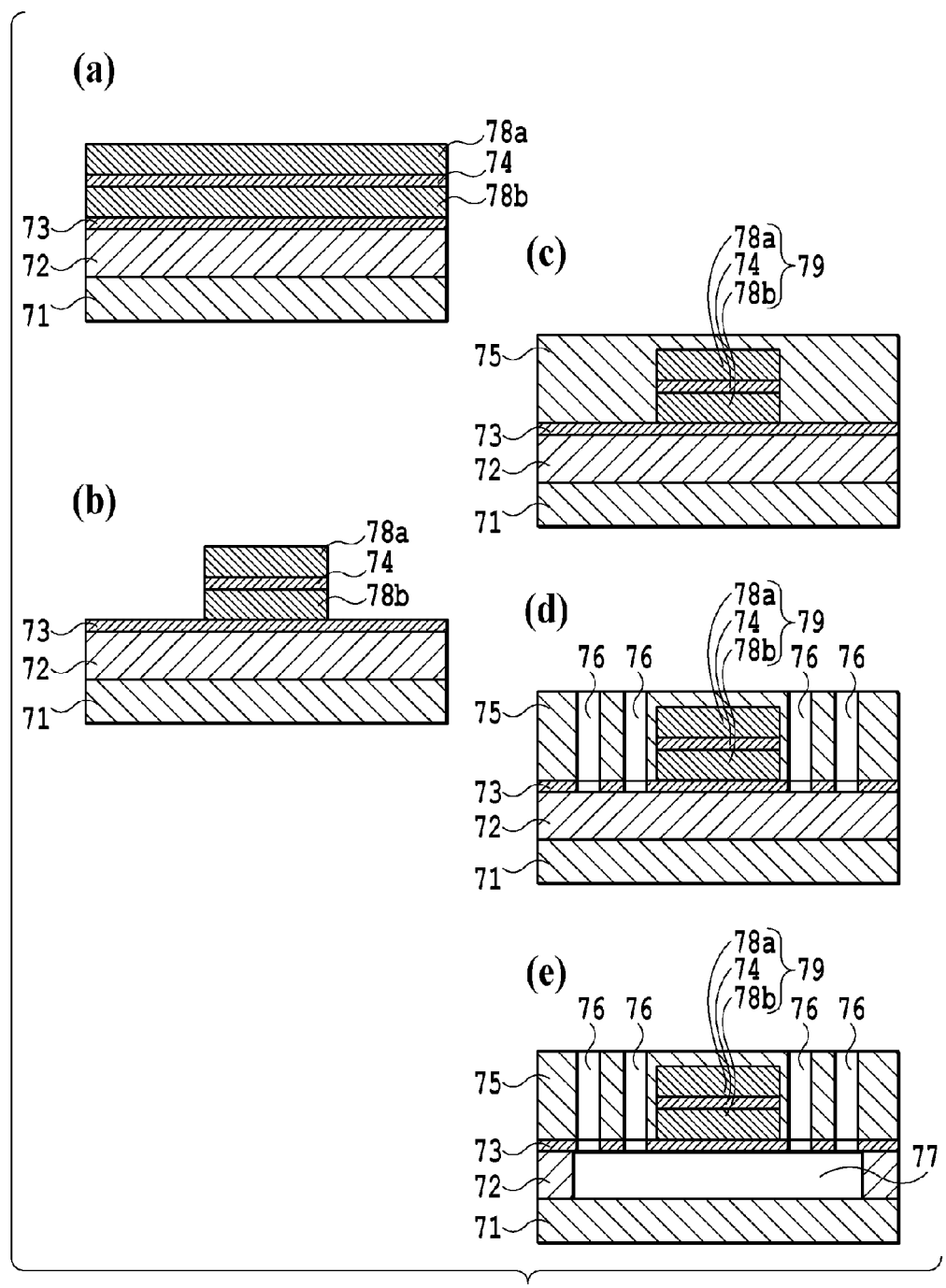
FIG. 7 is a process diagram showing the procedures of a fabrication method for a photonic crystal device according to a fourth embodiment of the present invention.

The photonic crystal device according to this embodiment is fabricated by performing the procedures in FIG. 7. First, as shown in FIG. 7(a), by the MOCVD (Metal Organic Chemical Vapor Deposition) method, an InGaAs sacrificial layer 72, an InP layer 73, an InGaAsP layer (a carrier confinement layer region) 78b, an InGaAs active layer 74 and an InGaAsP layer (a carrier confinement layer region) 78a are grown on an InP substrate 71 in the named order.

Sequentially, as shown in FIG. 7(b), the portions of the InGaAsP layer (the carrier confinement layer region) 78b, the InGaAs active layer 74 and the InGaAsP layer (the carrier confinement layer region) 78a, except for the portions that are employed to form an active region 79 that will be described later, are removed by etching.

The MOCVD method is employed again, and as shown in FIG. 7(c), an InP layer (a buried growth layer region) 75 is permitted to grow on the entire surface, so that an epitaxial growth substrate is obtained.

Thereafter, the above described epitaxial growth substrate is dry-etched, and as shown in FIG. 7(d), air holes 76 are formed. The plurality of air holes 76 are extended through the InP layer 75 and the InP layer 73. The plurality of air holes 76 are arranged, so that the adjacent air holes are periodically located, and the InGaAs active layer 74 is located in the center of the defect region.

Next, the InGaAs sacrificial layer 72 is wet-etched through the air holes 76. As a result, as shown in FIG. 7(e), an air hole 77 is formed in a layer below the region that is enclosed by the air holes 76 in the two-dimensional direction.

Therefore, through performing the above described process, a photonic crystal device can be fabricated, wherein the active region 79, in which the carrier confinement layer 78a and 78b formed of InGaAsP are provided on the top and bottom of the active layer 74 formed of InGaAs, is arranged inside the buried growth layer region that includes the InP layer 73 and the InP layer 75, and wherein the plurality of air holes 76 are formed in the buried growth layer regions (73 and 75). In this embodiment, a single quantum well structure wherein a single InGaAs layer 74 is sandwiched by the InGaAsP layers on both sides is employed. However, the structure of the active layer is not limited to this, and a multi-quantum well structure wherein a plurality of InGaAs well layers and InGaAsP barrier layers are repetitively employed, or a bulk structure that does not employ a quantum well structure can also be employed for an active layer.

(Fifth Embodiment)

A photonic crystal device according to a fifth embodiment of the present invention will be described, while referring to FIG. 8. The photonic crystal device of the fifth embodiment includes a photonic crystal, and a waveguide that is coupled with an active region is provided.

Figure 8:
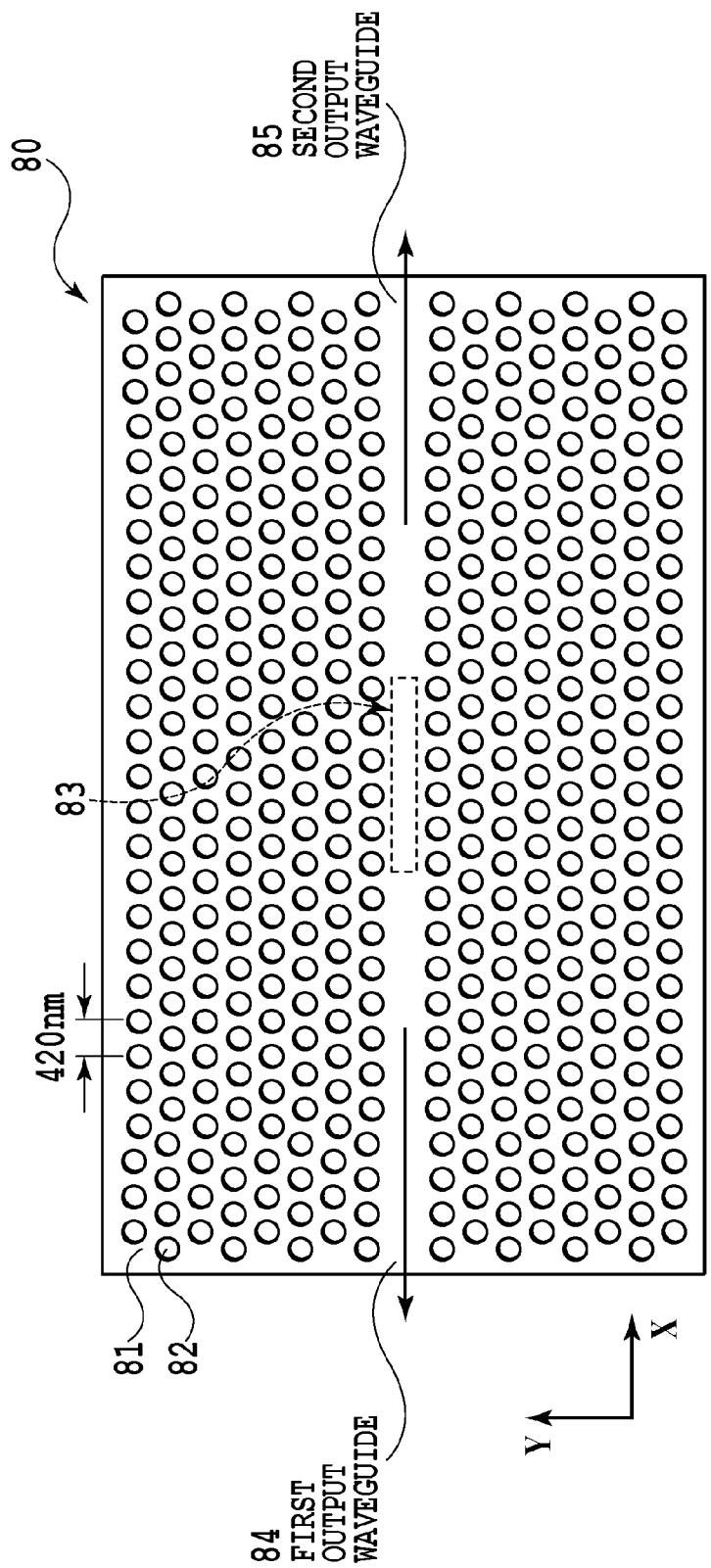
FIG. 8 is a plan view of a photonic crystal device according to a fifth embodiment of the present invention.

As shown in FIG. 8, a photonic crystal device 80 includes a photonic crystal wherein air holes 82 are periodically formed in a buried growth layer region 81 in the direction of two-dimensional plane, and a defect region where the air holes 82 are not formed is arranged in the center and in the longitudinal direction in the drawing. This defect that is linearly formed in the photonic crystal in this manner is called a line defect, which serves as an optical waveguide. An active region 83 is formed near the center and in the longitudinal direction of the defect region. A set of InGaAs and GaAs, or a set of InGaAs and InP, can be employed as a set for the active region 83 and the buried growth layer region 81. With such an arrangement, the oscillation wavelength of a laser is longer than the bandgap wavelength of the buried growth layer region 81, and light absorption is extremely low. Thus, a first output waveguide 84 is formed on the left of the active region 83, while a second output waveguide 85 is formed on the right of the active region 83.

For a laser that performs oscillation at the 1.5 μm wavelength range, a distance between the adjacent air holes is set at near 420 nm. Therefore, since light oscillated from the active layer of the active region 83 is output mainly in a direction for the lowest reflectance, output of light is not output from surface normal directions of the photonic crystal device. Instead, light is passed through the first output waveguide 84 and is output from the left of the photonic crystal device 80, and is also passed through the second output waveguide 85 and is output from the right of the photonic crystal device 80. As a result, efficient light extraction with the two-dimensional slab is enabled.

Therefore, according to the photonic crystal device 80 of this embodiment, another optical device that is adjacently arranged can be easily connected through the waveguide 84 or 85, and a waveguide that connects a laser and a receiving device, for example, can be formed, so that a large-scale photonic integrated circuit can be fabricated.

(Sixth Embodiment)

A photonic crystal device according to a sixth embodiment of the present invention will be explained, while referring to FIG. 9. The photonic crystal device of the sixth embodiment is a device that includes the same structure as the photonic crystal device of the above described first embodiment, wherein a buried growth layer region is formed in a chemical compound (group III-V mixed crystal), for which thermal conductivity is higher than that for an active layer. In this embodiment, an InGaAs layer is employed as a sacrificial layer to form an air-gap structure, and different chemical compounds (group III-IV mixed crystals) are employed for a buried growth layer region and for a carrier confinement layer.

Figure 9:
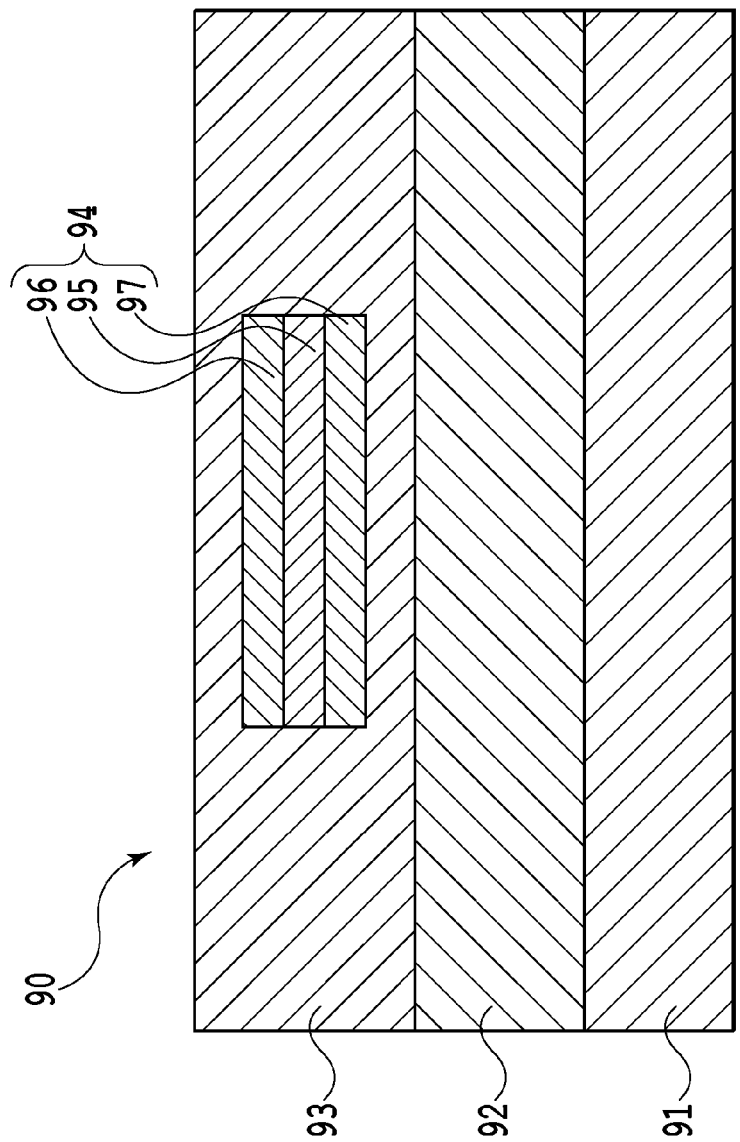
FIG. 9 is a cross-sectional view of a photonic crystal device according to a sixth embodiment of the present invention.

For a photonic crystal device 90 according to this embodiment, as shown in FIG. 9, an InGaAs sacrificial layer 92 and an InP buried growth layer region 93 are formed on an InP substrate 91 in the named order. An active region 94 is formed within the InP buried growth layer region 93. The active region 94 includes an active layer 95 formed of InGaAs, and upper and lower carrier confinement layers 96 and 97 that is formed of InGaAsP and that are provided on the top and bottom of the active layer 95. A bandgap wavelength λg, for both of the upper and lower carrier confinement layers 96 and 97, is set as 1.35 μm. The bandgap wavelength of the active layer 95 in the quantum well state is set as 1.55 μm. That is, for the photonic crystal device 90, the oscillation wavelength is set at from 1500 to 1600 nm, and the photoluminescence wavelength of a light absorption layer is set at from 1300 nm to 1400 nm. With this arrangement, unnecessary generation of heat can be suppressed to about half, compared with a 980-nm laser, which is generally used for light excitation, is employed. Further, excitation can be performed by using a 1300-nm wavelength range laser that is employed as a laser in an access network system, etc., and the cost of an excitation light source can also be reduced.

Therefore, since the above described photonic crystal device 90 employs the structure wherein laser oscillation is performed by light excitation, and pumping light is mainly absorbed at the active region 94. Since the coefficient of absorption of the pumping light at the buried growth layer region 93 is smaller than the coefficient of absorption at the carrier confinement layers 96 or 97, unwanted light absorption that is not directly related to laser oscillation is prevented. Thus, a rise in temperature of the active layer 95 that is caused by light absorption can also be prevented, and a higher output can be obtained.

(Seventh Embodiment)

A photonic crystal device according to a seventh embodiment of the present invention will be described, while referring to FIGS. 10 and 11. The photonic crystal device of the seventh embodiment includes a photonic crystal, and a waveguide that is coupled with an active region is provided.

Figure 10:
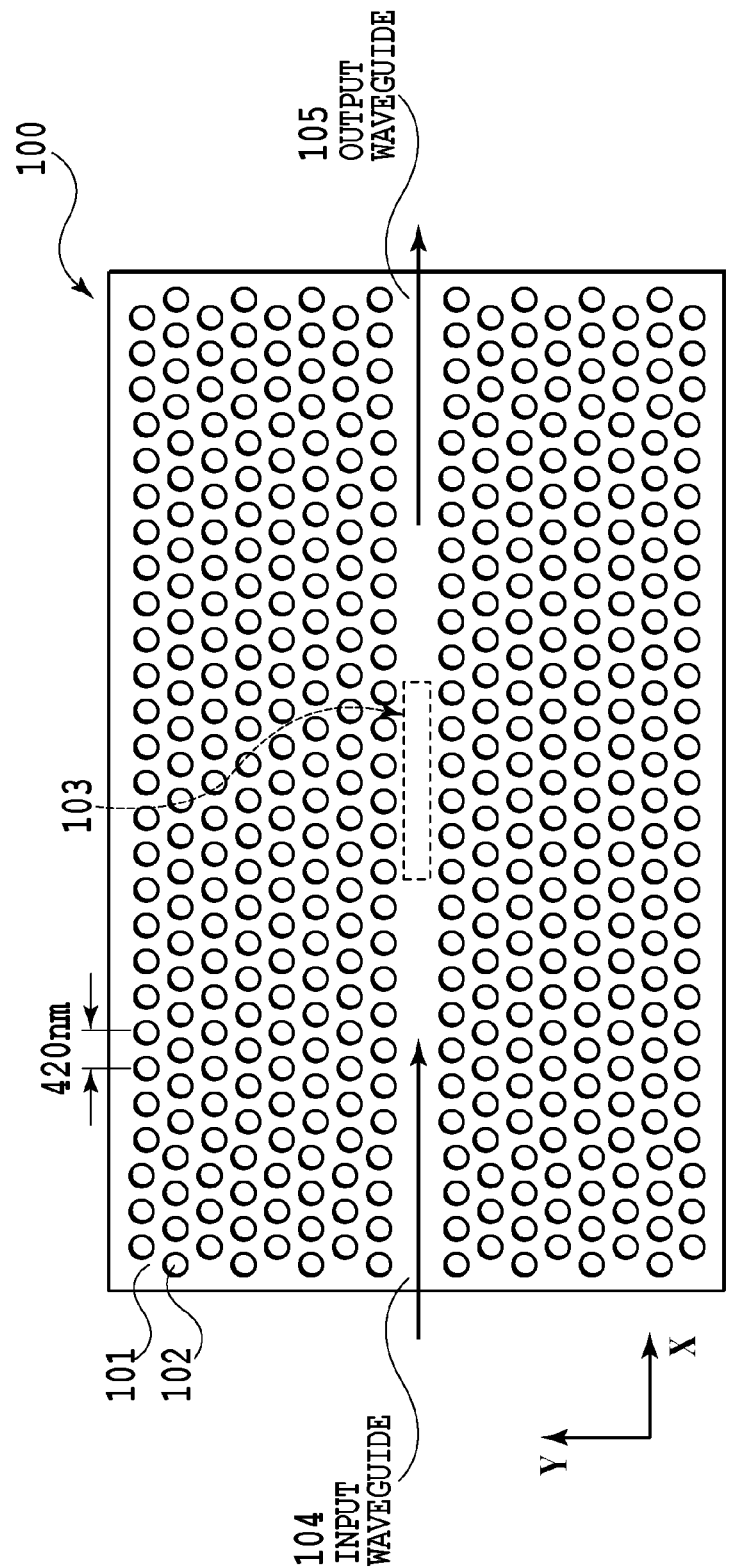
FIG. 10 is a plan view of a photonic crystal device according to a seventh embodiment of the present invention.

As shown in FIG. 10, a photonic crystal device 100 includes a photonic crystal wherein air holes 102 are periodically formed in a buried growth layer region 101 in the direction of two-dimensional plane, and a defect region where the air holes 102 are not formed is arranged in the center and in the longitudinal direction in the drawing. An active region 103 is formed near the center in the longitudinal direction of the detect region. For the active region 103, the same chemical compound as used for the active region 94 included in the photonic crystal device 90 of the sixth embodiment described above is employed. Thus, an input waveguide 104 is formed on the left of the active region 103, while an output waveguide 105 is formed on the right of the active region 103.

Therefore, light excitation of the active region 103 in the longitudinal direction is enabled. As a result, since the carrier confinement layers have a large absorption coefficient (5000 $cm^{-1}$ or greater) relative to light of 1.3 μm, 80% or higher of light absorption at several microns is obtained.

Figure 11:
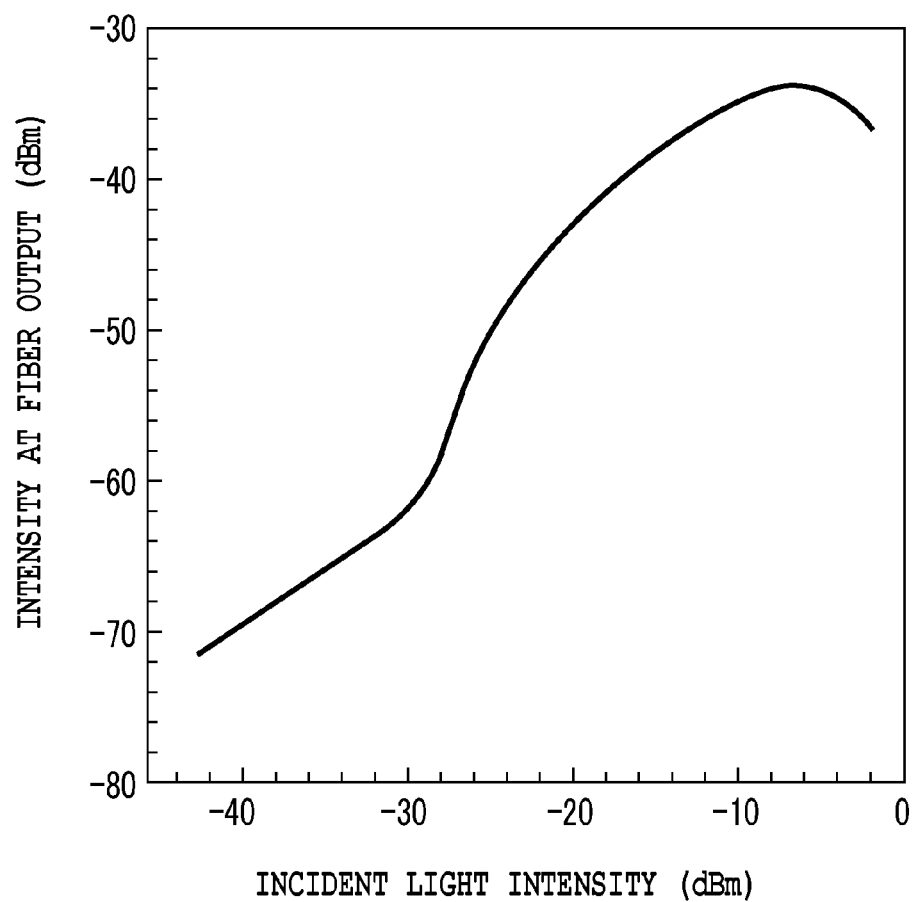
FIG. 11 is a graph showing the oscillation characteristics of the photonic crystal device according to the seventh embodiment of the present invention.
Figure 18A:
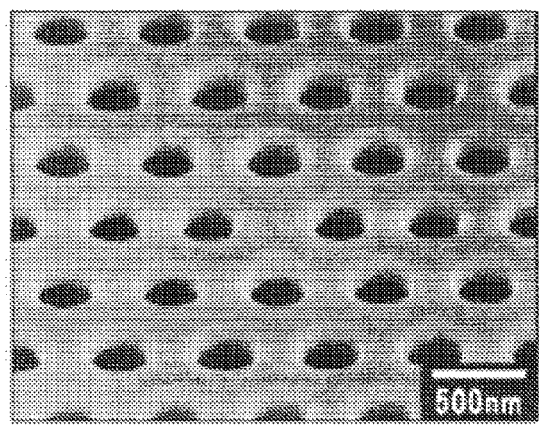
FIG. 18A is a diagram showing an electron micrograph for a conventional photonic crystal.
Figure 18B:
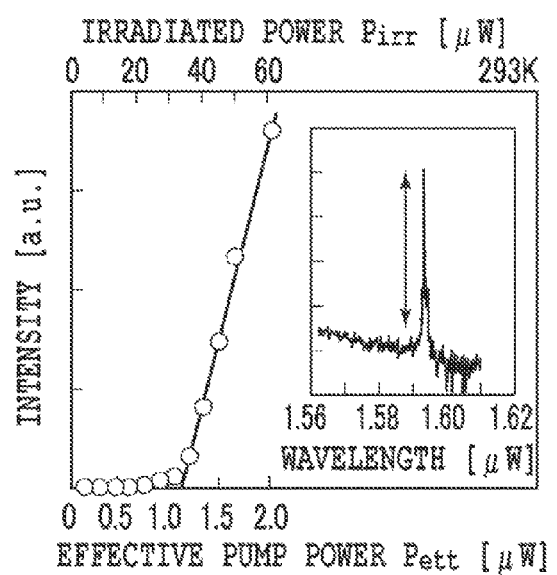
FIG. 18B is a diagram showing the oscillation characteristics of the conventional photonic crystal.
Figure 18C:
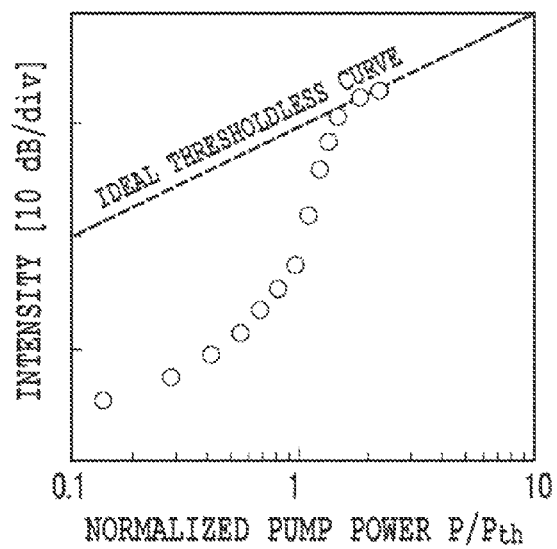
FIG. 18C is a diagram showing the normalized oscillation characteristics of the conventional photonic crystal.

Here, the input/output characteristics of the thus fabricated photonic crystal device (the semiconductor laser) are shown in FIG. 11. In FIG. 11, the horizontal axis represents an incident light intensity, and the vertical axis represents an intensity at a fiber output. As shown in FIGS. 11 and 18B, light excitation is enabled with the incident light intensity that is two digits or more higher than the threshold value. Further, since carriers generated by light excitation can be efficiently confined, the threshold value also becomes very small, i.e., 1.5 microwatt.

(Eighth Embodiment)

A photonic crystal device according to an eighth embodiment of the present invention will be described, while referring to FIG. 12. The photonic crystal device of the eighth embodiment includes a photonic crystal, and a waveguide that is coupled with a core region is provided.

Figure 12:
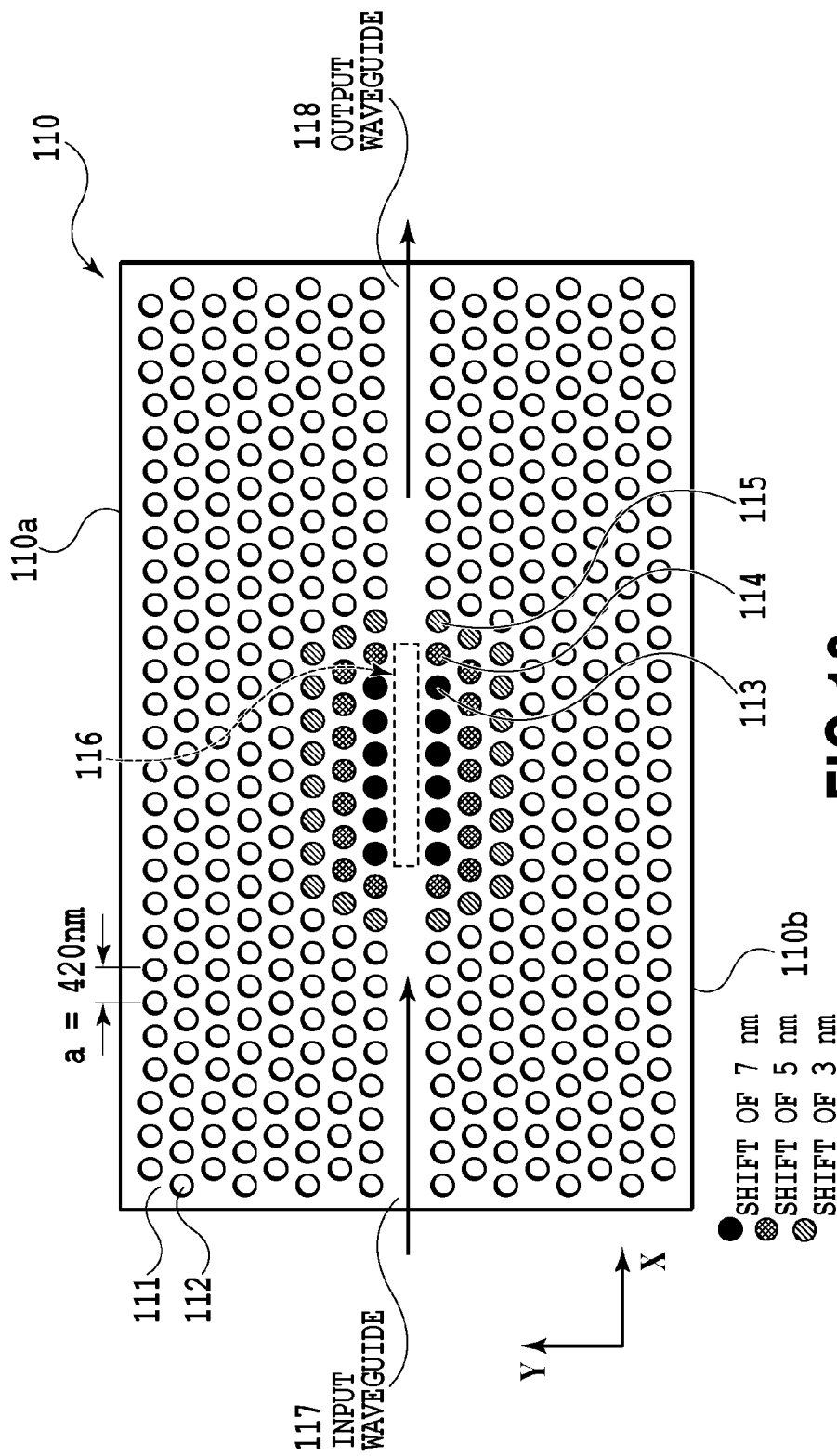
FIG. 12 is a plan view of a photonic crystal device according to an eighth embodiment of the present invention.

As shown in FIG. 12, a photonic crystal device 110 includes a photonic crystal wherein air holes 112 are formed, in the two-dimensional direction, in a buried growth layer region 111, periodically, e.g., at a distance a of 420 nm between the adjacent air holes 112, and a defect region where the air holes 112 are not formed is arranged in the center and in the longitudinal direction in the drawing. An active region 116 is formed near the center in the longitudinal direction of the defect region. The active region 116 is a region that includes a core layer and carrier confinement layers provided on the top and bottom of the core layer to confine carriers. An input waveguide 117 is formed on the left of the active region 116, while an output waveguide 118 is formed on the right of the active region 116.

Air holes 113 of the first layer adjacent to the active region 116 are formed by being shifted at a distance of 7 nm in a direction apart from the active region 116. Specifically, on the upper side of the active region 116, the air holes 113 of the first layer are formed by being shifted, at a distance of 7 nm, to one side 110a of the photonic crystal device 110. On the lower side of the active region 116, the air holes 113 of the first layer are formed by being shifted, at a distance of 7 nm, to the other side 110b of the photonic crystal device 110.

Air holes 114 of the second layer adjacent to the active region 116 are formed by being shifted at a distance of 5 nm in a direction apart from the active region 116. Specifically, on the upper side of the active region 116, the air holes 114 of the second layer are formed by being shifted, at a distance of 5 nm, to the side 110a of the photonic crystal device 110. On the lower side of the active region 116, the air holes 114 of the second layer are formed by being shifted, at a distance of 5 nm, to the other side 110b of the photonic crystal device 110.

Air holes 115 of the third layer adjacent to the active region 116 are formed by being shifted at a distance of 3 nm in a direction apart from the active region 116. Specifically, on the upper side of the active region 116, the air holes 115 of the third layer are formed by being shifted, at a distance of 3 nm, to the side 110a of the photonic crystal device 110. On the lower side of the active region 116, the air holes 115 of the third layer are formed by being shifted, at a distance of 3 nm, to the other side 110b of the photonic crystal device 110.

As described above, since the air holes 113, 114 and 115 are formed around the active region 116 by being slightly shifted to each other, a resonator having a high Q value can be obtained.

(Ninth Embodiment)

A photonic crystal device according to a ninth embodiment of the present invention will be described, while referring to FIG. 13. The photonic crystal device of the ninth embodiment includes a photonic crystal, and a waveguide that is coupled with a core region is provided.

Figure 13:
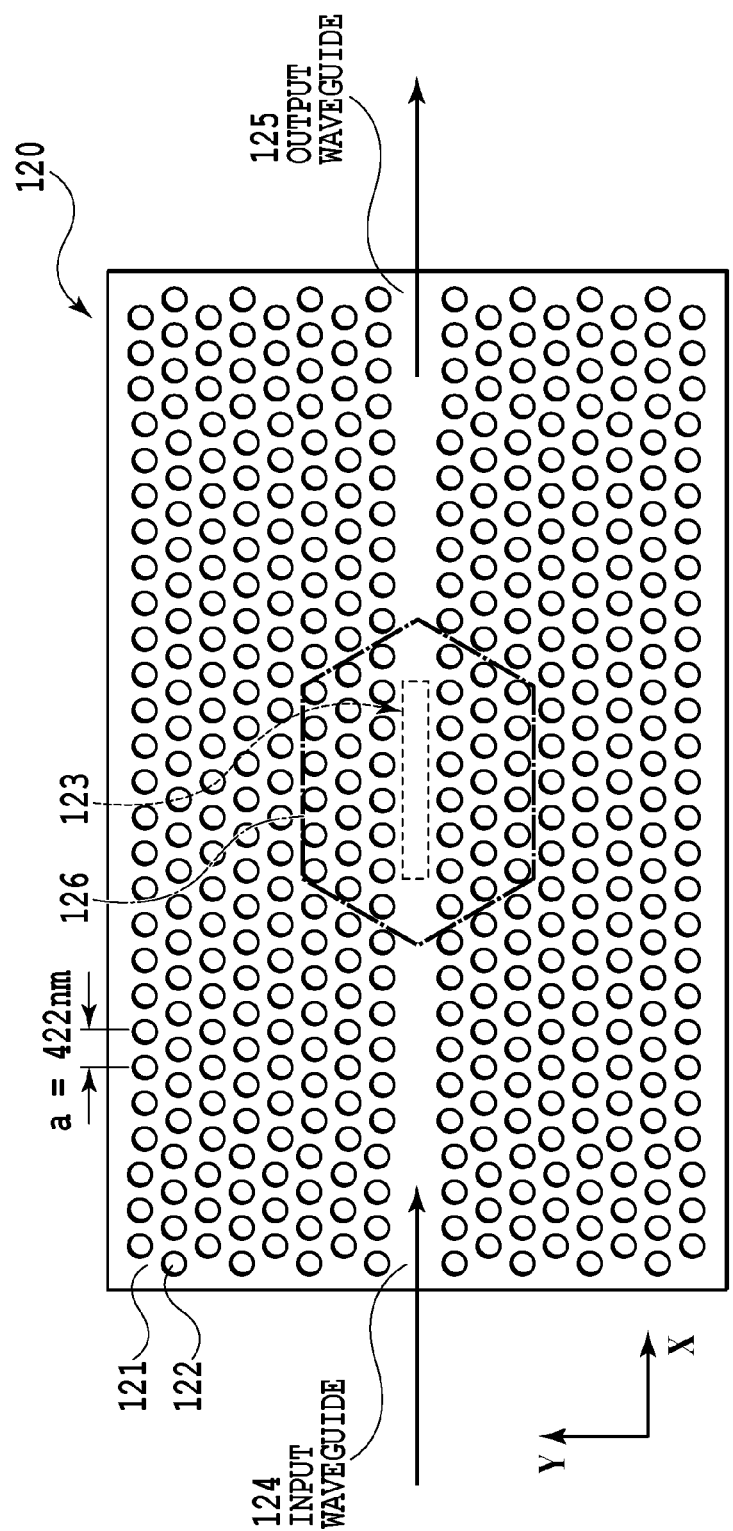
FIG. 13 is a plan view of a photonic crystal device according to a ninth embodiment of the present invention.

As shown in FIG. 13, a photonic crystal device 120 includes a photonic crystal wherein air holes 122 are periodically formed in a buried growth layer region 121 in the two-dimensional direction, and a defect region where the air holes 122 are not formed is arranged in the center and in the longitudinal direction in the drawing. An active region 123 is formed near the center in the longitudinal direction of the defect region. The active region 123 is a region that includes an active layer and carrier confinement layers that are provided on the top and bottom of the active layer to confine carriers. An input waveguide 124 is formed on the left of the active region 123, while an output waveguide 125 is formed on the right of the active region 123.

In this embodiment, air holes 122 are periodically formed also in a region 126 located near the active region 123, as well as in the other portions where the plurality of air holes 122 are formed. In other words, a distance between the two adjacent air holes of the plurality of air holes 122 that are adjacent to the active region 123 is the same as a distance between the two adjacent air holes of the plurality of air holes 122 that are not adjacent to the active region 123, and this distance here is 422 nm.

Therefore, according to the photonic crystal device 120 of this embodiment, light can be confined by using a high refractive index of the active layer, without the positions of the air holes being shifted to form a resonator, and unwanted resonance peaks can be reduced.

This is effective especially in cases where a difference in a refractive index between the active layer of the active region 123 and the buried growth layer region 121 is increased. In cases where a difference in a refractive index between the active layer and the buried growth layer region 121 is increased, a spatial distribution differs between two regions, i.e., a resonator region formed by shifting the air holes and a high refractive index region of the active layer. In this case, the resonator becomes a multiple resonator, and a plurality of unwanted resonance peaks for oscillation is present. However, since shifting of the positions of the air holes 122 is eliminated, this problem can be avoided.

In cases where, even though shifting of air holes is eliminated, a difference in a refractive index between the active layer of the active region 123 and the buried growth layer region 121 is still large, and where a resonator becomes a multiple resonator and a plurality of unwanted resonance peaks for oscillation are present, the air holes 122 may be formed by being shifted in a direction closer to the active layer of the active region 123 so as to reduce a difference in a refractive index between the active layer and the buried growth layer region 121, so that the characteristics of the resonator may be improved.

As described above, in this embodiment and the eighth embodiment previously described, the air holes in the region located near the active region have been employed to perform a fine adjustment process for a change in equivalent refractive index. The adjustment process in the embodiments is performed for smoothly changing the equivalent refractive index of the resonator of the photonic crystal in order to obtain a high Q value.

For the first to the ninth embodiments described above, cases where the photonic crystal device is applied for a semiconductor laser has been employed. However, the photonic crystal device can also be applied for an optical semiconductor switch that employs a change in transmittance that occurs with refractive index modulation. In cases where the photonic crystal device is applied for an optical semiconductor device, the same effects as obtained by the above described photonic crystal device can also be acquired, and the operation with a low power that is appropriate for integration can be performed.

According to the present invention, since a photonic crystal laser having a low threshold value and providing high efficiency and an optical switch performing low-power operation can be provided, this invention is very useful for the optical communications industry.

Figure 14:
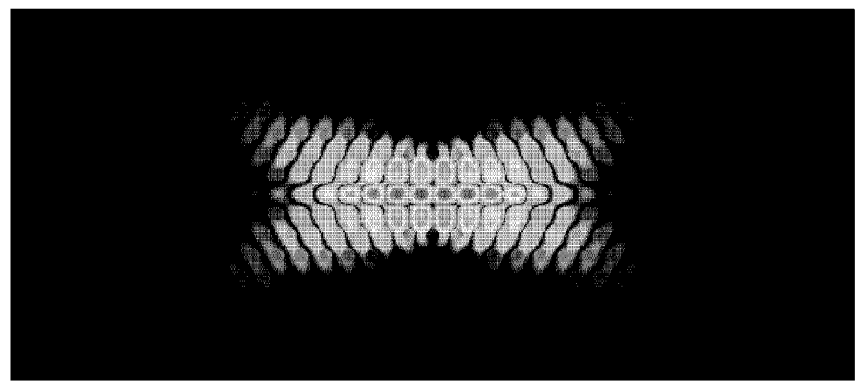
FIG. 14 is a diagram showing the results obtained by calculating the optical field of a resonant wavelength that is confined in the resonator (light confinement region) portion of a photonic crystal device 120 in FIG. 13.

FIG. 14 is a diagram showing the results obtained by calculating the optical field for a resonant wavelength that is confined in the resonator (light confinement region) portion of the photonic crystal device 120 in FIG. 13. As shown in FIG. 14, it is observed that, in the structure where a core layer having a large refractive index is buried in the line defect waveguide of the photonic crystal, the optical field is extended to the four corners. Therefore, in cases where an output waveguide is to be coupled with the resonator having such an optical field, an input/output waveguide should be located on an extended line for the optical field, instead of being provided in the longitudinal direction of the core layer as shown in FIG. 13, so that the resonator can be coupled with the waveguide more efficiently.

Figure 15:
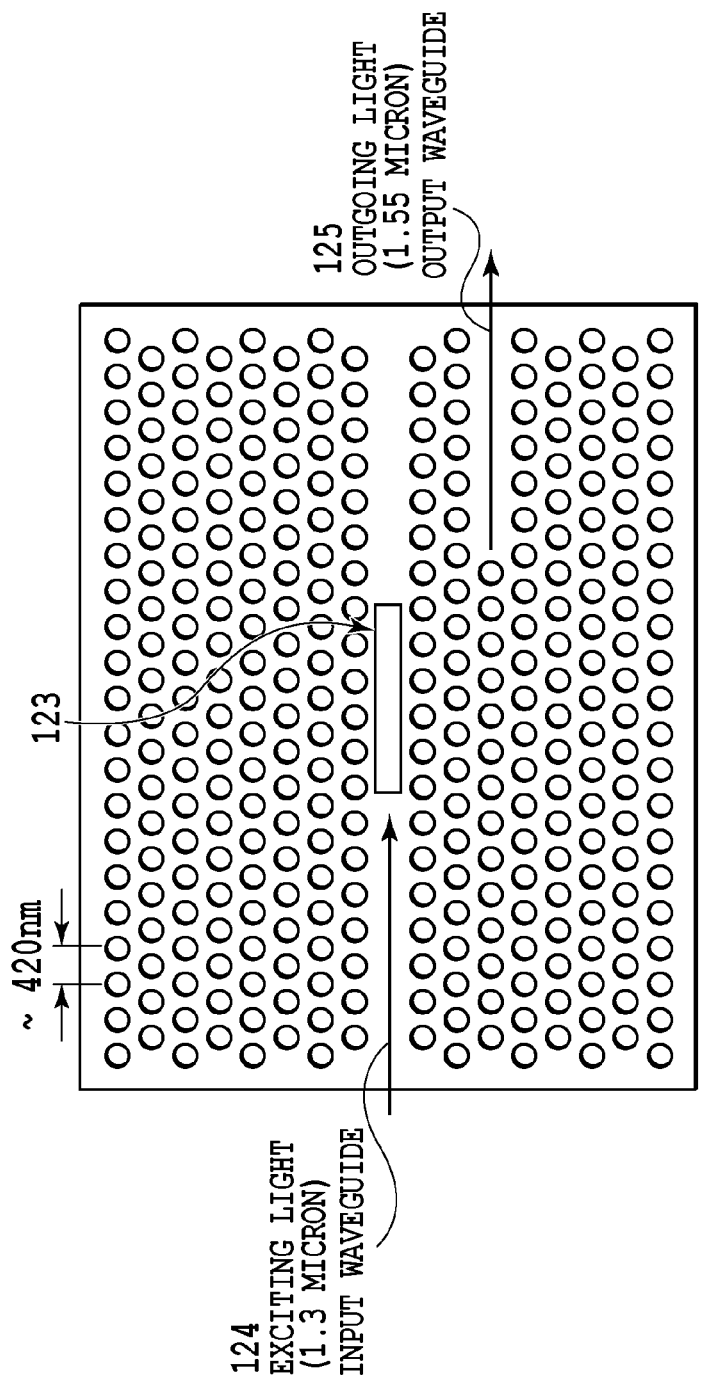
FIG. 15 is a diagram showing an example in a case of realizing a semiconductor laser wherein an output waveguide is located along an extended line for the optical field of a resonant wavelength that is confined in a resonator.

An example for cases where a semiconductor laser is provided is shown in FIG. 15. In the case of this example, a core layer is excited by using pumping light having a wavelength of 1.3 µm, and a laser beam of 1.55 µm is output. Since a resonator that is designed to have a resonant wavelength of 1.55 micron has the same function as a normal line defect, relative to pumping light of 1.3 µm, a line defect waveguide that is provided, as well as in FIG. 13, in the longitudinal direction of the core layer is employed as an input waveguide 124. However, as shown in FIG. 14, since the optical field for the 1.55 µm laser beam, oscillated using the pumping light, is extended from the active layer, an output waveguide 125 is set so as to be coupled with one portion of the optical field.

Figure 16A:
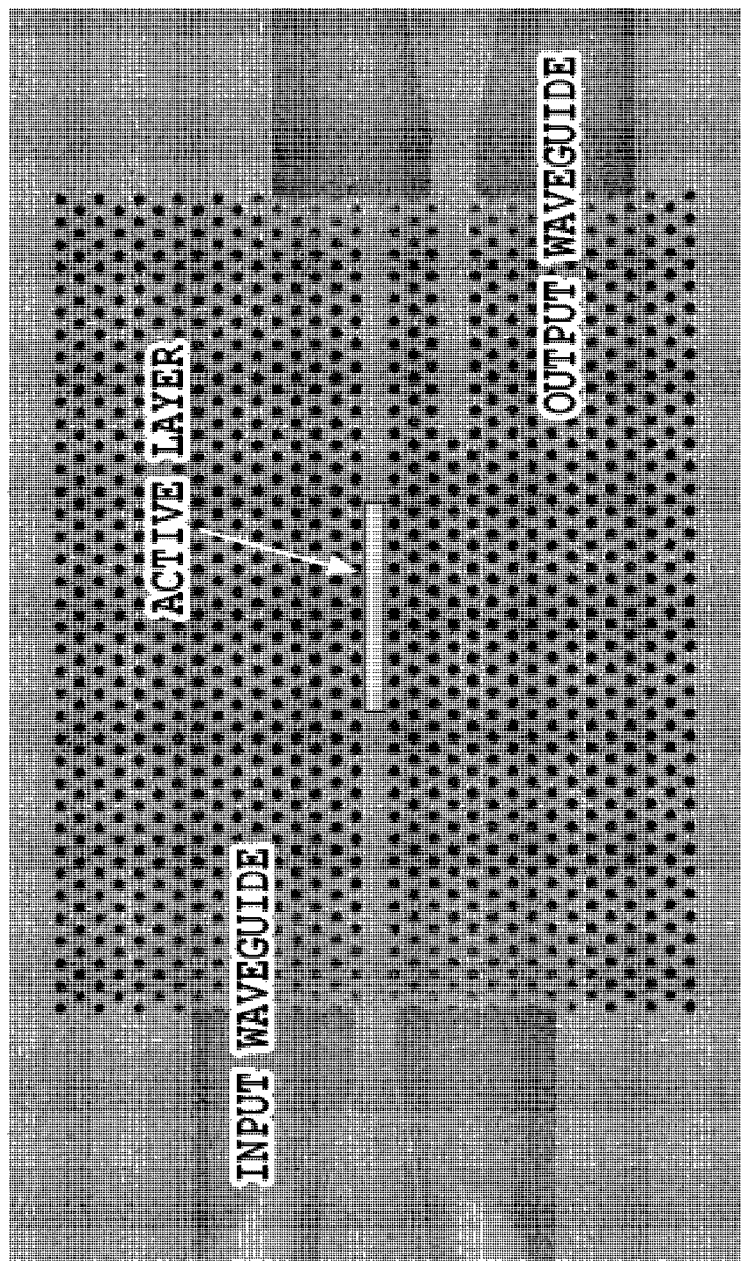
FIG. 16A is a diagram showing an electron micrograph for the semiconductor laser in FIG. 15.
Figure 16B:
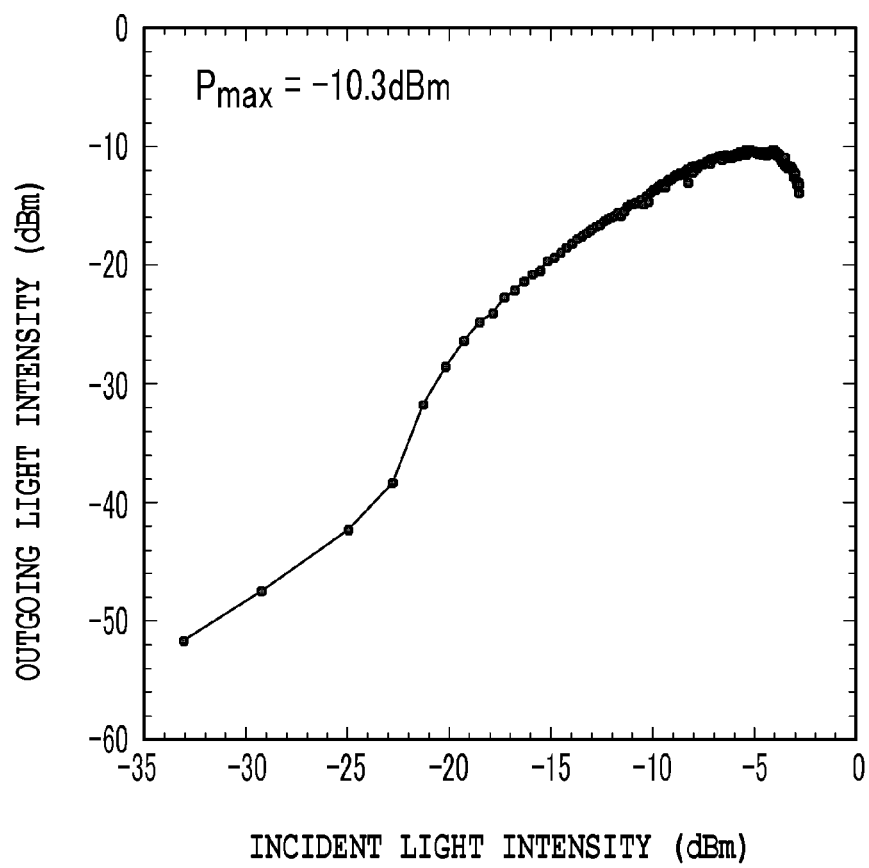
FIG. 16B is a diagram showing the measurement results obtained by the semiconductor laser in FIG. 15.

An electron micrograph for the device fabricated based on this design and the measurement results are shown respectively in FIGS. 16A and 16B. Compared with that in FIG. 11, the outgoing light intensity is greatly increased, and the maximum outgoing light of −10.5 dBm is coupled with the output waveguide. Since the optical field of the resonator in FIG. 13 is extended equally in the four directions, an arbitrarily number of output waveguides can be selected, from 1 to 4.

Figure 17:
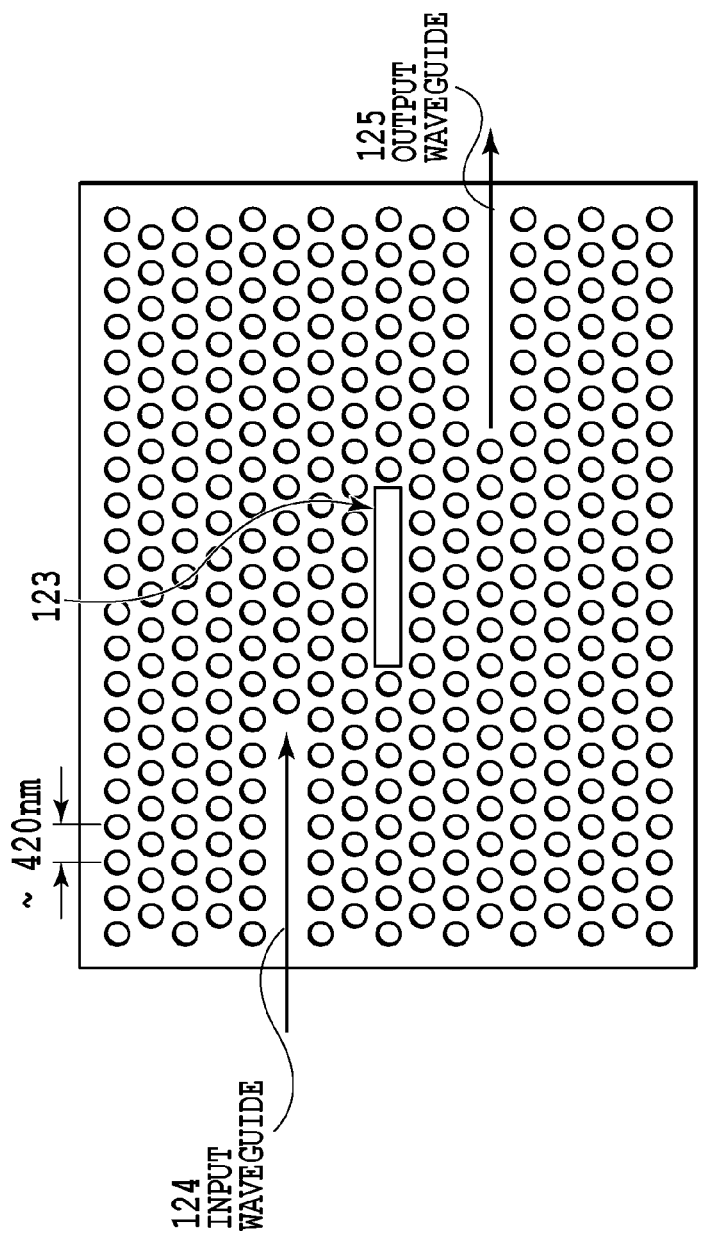
FIG. 17 is a diagram showing an example in a case of realizing an optical switch wherein an input/output waveguide is located along an extended line for the optical field of a resonant wavelength that is confined in a resonator.

A structure in FIG. 17 is shown for a case wherein this device is applied for an optical switch that inputs and outputs light at 1.55 µm. In this case, since light of 1.55 µm is input or output relative to a resonator, both waveguides are provided obliquely, relative to the active layer. It should be noted that arbitrary light coupling coefficients for the input/output waveguide and the resonator can be selected based on the distance between the core layer and the waveguides, and the positions thereof.

The invention claimed is:

1. A photonic crystal device, comprising:
a photonic crystal where first and second media having different refractive indexes are regularly arranged; and
an active region positioned inside the photonic crystal and encircled by the first medium so as to not contact the second medium,
wherein the active region includes an active layer and carrier confinement layers provided on the top and bottom of the active layer for confining carriers, and
wherein the first medium has a larger bandgap than that of the active region.

2. The photonic crystal device according to claim 1, wherein thermal conductivity of the first medium is higher than thermal conductivity of the active region.

3. The photonic crystal device according to claim 1, further comprising a waveguide coupled with the active region in the photonic crystal for guiding light.

4. The photonic crystal device according to claim 3, wherein the waveguide is located along an extended line for an optical field of a resonant wavelength confined in a light confinement region of the photonic crystal device.

5. The photonic crystal device according to claim 1, wherein:
the photonic crystal includes air holes formed periodically; and
for the plurality of air holes, a distance between air holes adjacent to the active region is a distance for reducing a difference of equivalent refractive index between the active layer and the first medium.

6. A semiconductor laser, comprising:
a photonic crystal device according to claim 1,
wherein a structure is employed such that laser oscillation is performed by light excitation, and pumping light is mainly absorbed at the active region, and
wherein an absorption coefficient of pumping light at the first medium is set no smaller than an absorption coefficient at the carrier confinement layer.

7. A semiconductor laser according to claim 6, wherein, where an oscillation wavelength is set at from 1500 nm to 1600 nm, a photoluminescence wavelength of the active region is set at from 1300 nm to 1400 nm.

8. A semiconductor optical switch that employs a change in transmittance, which occurs with modulation of a refractive index, the semiconductor optical switch comprising a photonic crystal device according to claim 1.

9. A photonic crystal device, comprising:
a photonic crystal comprised of first and second media that are regularly arranged, the first medium having a different refractive index than the second medium, a portion of the first medium forming a defect region;
an active region formed entirely within the defect region so as to not contact the second medium, the active region comprising an active layer sandwiched between opposing carrier confinement layers, the first medium having a larger bandgap than the active region.

10. The photonic crystal device according to claim 9, wherein the upper carrier confinement layer, the lower confinement layer, and the first medium form a carrier confinement region that encircles the active layer.

11. The photonic crystal device according to claim 9, wherein the photonic crystal includes a plurality of holes periodically formed therein.

12. The photonic crystal device according to claim 11, wherein the second medium comprises air positioned within the plurality of holes.

13. A photonic crystal device, comprising:
a photonic crystal comprised of a growth layer region having a plurality of holes formed therein;
a defect region formed within the growth layer region, the defect region being free of holes;
an active region entirely encased within the defect region, the defect region having a larger bandgap than the active region, the active region comprising:
a lower carrier confinement layer;
an active layer formed on the lower carrier confinement layer; and
an upper carrier confinement layer formed on the active layer.

14. The photonic crystal device according to claim 13, wherein the active region does not contact any of the holes.

* * * * *